United States Patent
Chen (10) Patent No.: US 12,495,605 B2
(45) Date of Patent: Dec. 9, 2025

(54) POWER SEMICONDUCTOR DEVICE

(71) Applicant: Hon Young Semiconductor Corporation, Hsinchu (TW)

(72) Inventor: Yan-Ru Chen, Hsinchu (TW)

(73) Assignee: Hon Young Semiconductor Corporation, Hsinchu (TW)

( * ) Notice: Subject to any disclaimer, the term of this patent is extended or adjusted under 35 U.S.C. 154(b) by 435 days.

(21) Appl. No.: 18/171,321

(22) Filed: Feb. 17, 2023

(65) Prior Publication Data

US 2024/0079490 A1    Mar. 7, 2024

(30) Foreign Application Priority Data

Sep. 1, 2022 (TW) .................................. 111133228

(51) Int. Cl.
- *H10D 84/00* (2025.01)
- *H10D 30/66* (2025.01)
- *H10D 64/23* (2025.01)

(52) U.S. Cl.
CPC ......... *H10D 84/146* (2025.01); *H10D 30/665* (2025.01); *H10D 64/252* (2025.01)

(58) Field of Classification Search
CPC .. H10D 84/146; H10D 30/665; H10D 64/252; H10D 8/411; H10D 8/60; H10D 84/144; H10D 62/106

See application file for complete search history.

(56) References Cited

U.S. PATENT DOCUMENTS

| | | | |
|---|---|---|---|
| 6,967,374 B1 | 11/2005 | Saito et al. | |
| 2015/0069417 A1 | 3/2015 | Ryu | |
| 2015/0187877 A1* | 7/2015 | Park | H10D 62/157 257/139 |
| 2016/0155794 A1* | 6/2016 | Kim | H10D 64/117 438/135 |
| 2016/0284834 A1* | 9/2016 | Shimizu | H10D 62/106 |
| 2019/0296134 A1* | 9/2019 | Matsudai | H10D 64/117 |
| 2021/0273117 A1* | 9/2021 | Hoshi | H10D 62/834 |
| 2023/0050319 A1* | 2/2023 | Baba | H10D 62/157 |

FOREIGN PATENT DOCUMENTS

| | | |
|---|---|---|
| CN | 101075581 B | 6/2010 |
| CN | 112271218 A | 1/2021 |
| TW | 201517280 A | 5/2015 |
| TW | I745251 B | 11/2021 |

* cited by examiner

*Primary Examiner* — Steven B Gauthier
*Assistant Examiner* — Khatib A Rahman
(74) *Attorney, Agent, or Firm* — CKC & Partners Co., LLC (57) ABSTRACT

A power semiconductor device includes a substrate, an epitaxy layer, a source electrode, and a first metal layer. The substrate includes an active region, a buffer region, and a termination region. The buffer region surrounds the active region, and the termination region surrounds the active region. The epitaxy layer is located on the substrate. The epitaxy layer is located in the active region, the buffer region, and the termination region. The epitaxy layer has a first conductive type. The source electrode is located in the active region. The first metal layer is located in the buffer region. The first metal layer is connected to the source electrode.

17 Claims, 7 Drawing Sheets

POWER SEMICONDUCTOR DEVICE

CROSS-REFERENCE TO RELATED APPLICATION

This application claims priority to Taiwan Application Serial Number 111133228, filed Sep. 1, 2022, which is herein incorporated by reference in its entirety.

BACKGROUND

Field of Invention

The present invention relates to a power semiconductor device.

Description of Related Art

An extra diode is required to form a parallel circuit with the MOSFET in a power module to protect electrical circuits and improve performance. However, the MOSFET and the aforementioned diode are two separate packages in a power semiconductor device, and therefore the manufacturing process is complicate and the cost is higher. In addition, the parasitic diode of the MOSFET has small area. Therefore, electrical current can be loaded is lower, and the product requirement cannot be satisfied.

Accordingly, it is still a development direction for the industry to provide a power semiconductor device that can solve the problems mentioned above.

SUMMARY

One aspect of the present invention is a power semiconductor device.

In some embodiments, the power semiconductor device includes a substrate, an epitaxy layer, a source electrode, and a first metal layer. The substrate includes an active region, a buffer region, and a termination region. The buffer region surrounds the active region, and the termination region surrounds the active region. The epitaxy layer is located on the substrate. The epitaxy layer is located in the active region, the buffer region, and the termination region. The epitaxy layer has a first conductive type. The source electrode is located in the active region. The first metal layer is located in the buffer region. The first metal layer is connected to the source electrode.

In some embodiments, the power semiconductor device further includes a gate electrode located in the active region and a first oxide layer located in the active region. The first oxide layer surrounds the gate electrode, and the first metal layer surrounds the gate electrode and the first oxide layer.

In some embodiments, the power semiconductor device further includes a second oxide layer located in the termination region. The second oxide layer is connected to the first oxide layer.

In some embodiments, the termination region is located between the active region and the buffer region, and the buffer region surrounds the termination region.

In some embodiments, the power semiconductor device further includes a second oxide layer located in the termination region. The second oxide layer surrounds the first metal layer.

In some embodiments, the buffer region is located between the active region and the termination region, and the termination region surrounds the buffer region.

In some embodiments, the epitaxy layer further includes a doped region. The doped region is located in the buffer region. The doped region is located at a side of the epitaxy layer facing the first metal layer, and the doped region has a second conductive type.

In some embodiments, the epitaxy layer further includes multiple doped regions. The doped regions are located in the buffer region. The doped regions are located at a side of the epitaxy layer facing the first metal layer, and the doped regions have a second conductive type.

In some embodiments, the epitaxy layer further includes multiple trenches. The trenches are located in the buffer region. The first metal layer extends into the trenches, and the trenches are located above the doped regions.

In some embodiments, the epitaxy layer further includes multiple trenches. The trenches are located in the buffer region. The first metal layer extends into the trenches, and the doped regions surround the trenches.

Another aspect of the present invention is a power semiconductor device.

In some embodiments, the power semiconductor device includes a substrate, an epitaxy layer, a source electrode, and a first metal layer. The substrate includes an active region, a buffer region, and a termination region. The buffer region and the termination region have a ring shape, and the buffer region and the termination region are located outside the active region. The epitaxy layer is located on the substrate. The epitaxy layer is located in the active region, the buffer region, and the termination region. The source electrode is located in the active region. The first metal layer is located in the buffer region. The first metal layer is connected to the source electrode.

In some embodiments, the power semiconductor device further includes a drain electrode and a second metal layer. The drain electrode is located in the active region. The substrate and the epitaxy layer are located between the source electrode and the drain electrode. The second metal layer is located in the buffer region. The substrate and the epitaxy layer are located between the first metal layer and the second metal layer, and the second metal layer is connected to the drain electrode.

In some embodiments, the power semiconductor device further includes a gate electrode located in the active region and a first oxide layer located in the active region. The first oxide layer surrounds the gate electrode, and the first metal layer surrounds the gate electrode and the first oxide layer.

In some embodiments, the buffer region is located between the active region and the termination region, and the termination region surrounds the buffer region.

In some embodiments, the termination region is located between the active region and the buffer region, and the buffer region surrounds the termination region.

Another aspect of the present invention is a power semiconductor device.

In some embodiments, the power semiconductor device includes a substrate, an epitaxy layer, and a diode. The substrate includes an active region and a termination region. The epitaxy layer is located on the substrate. The epitaxy layer is located in the active region and the termination region, and the epitaxy layer has a first conductive type. The diode is located outside the active region. The diode surrounds the active region, and the active region, the diode, and the termination region are connected to each other.

In some embodiments, the diode includes a first metal layer, and the power semiconductor device further includes a source electrode located in the active region. The first metal layer is connected to the source electrode.

In some embodiments, the diode is located between the active region and the termination region, and the termination region surrounds the diode.

In some embodiments, the termination region is located between the active region and the diode, and the diode surrounds the termination region.

In some embodiments, the diode further includes a doped region, and the doped region has a second conductive type.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
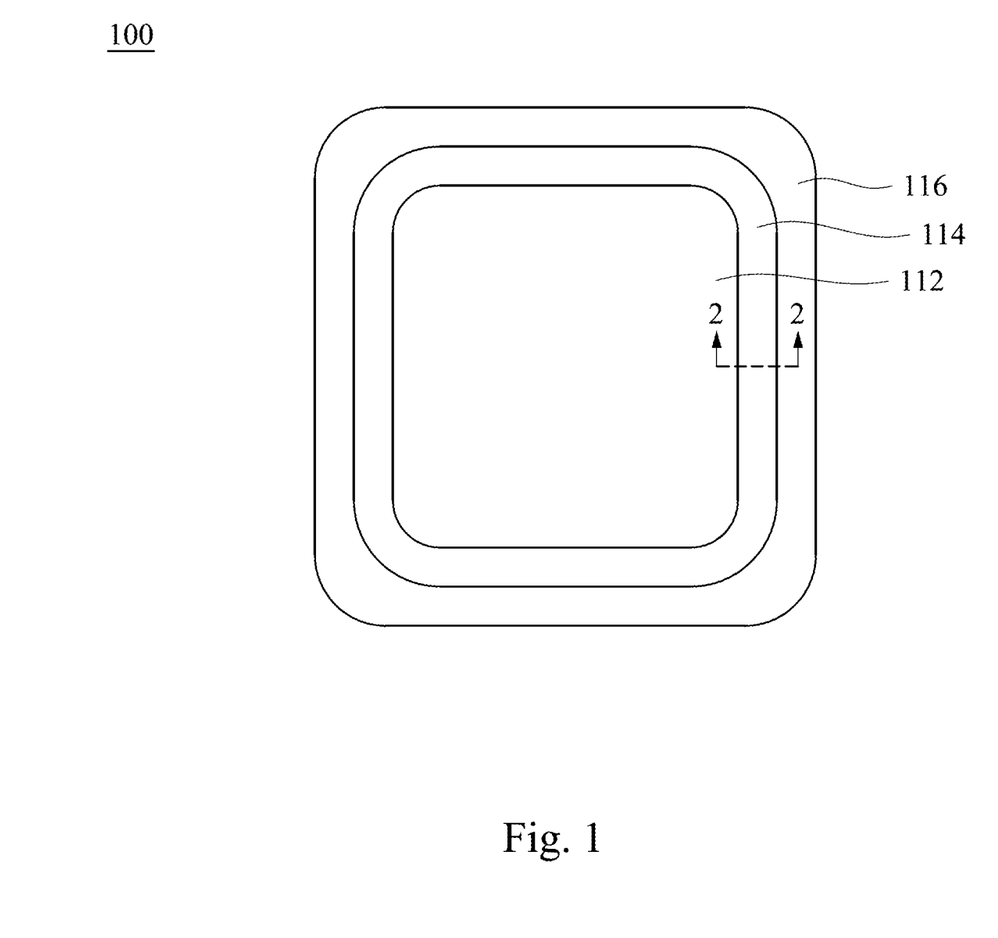
FIG. 1 is a top view of a power semiconductor device according to one embodiment of the present disclosure.
Figure 2:
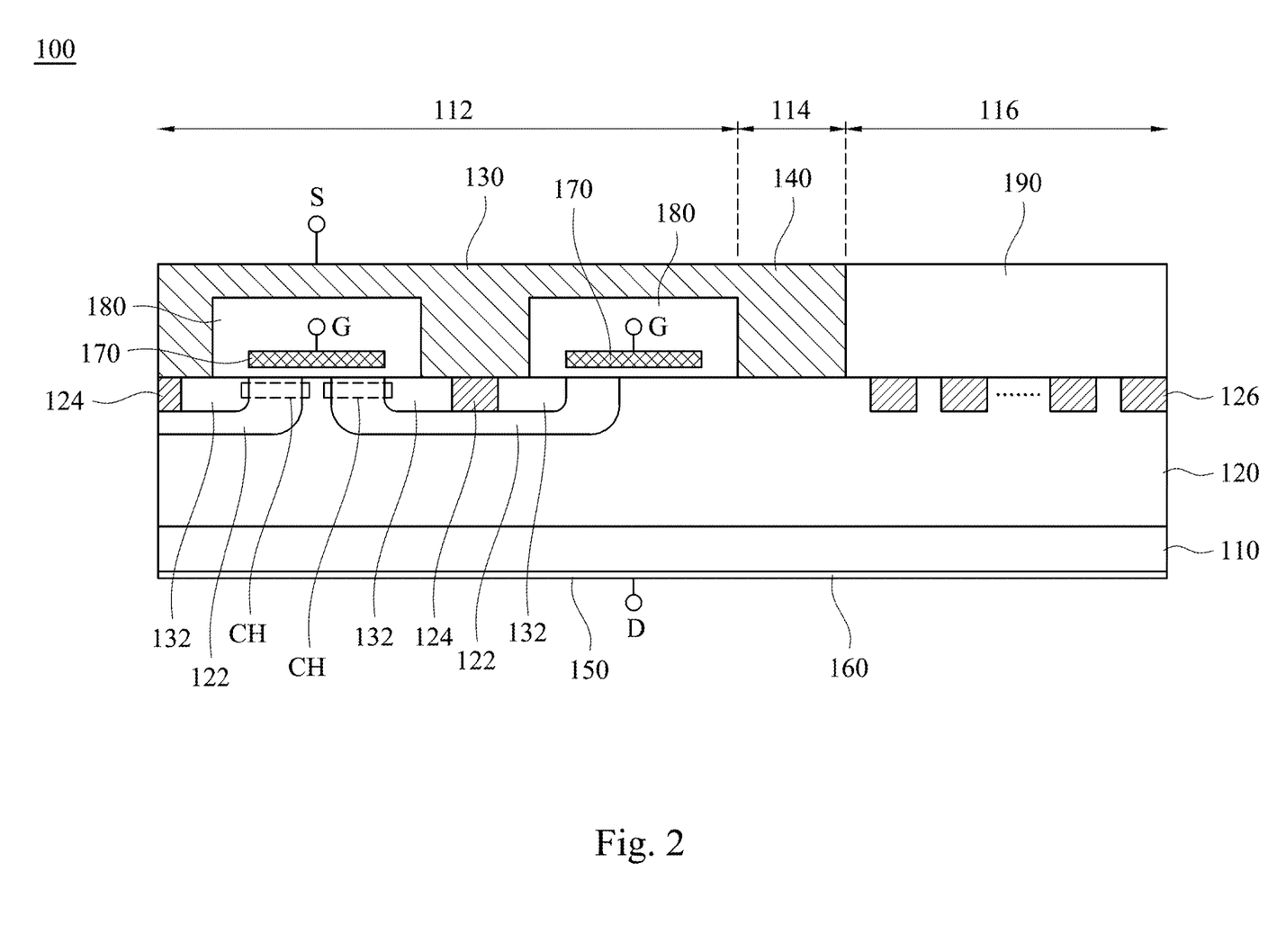
FIG. 2 is a cross-sectional view taken along line 2-2 in FIG. 1.

FIG. 1 is a top view of a power semiconductor device 100 according to one embodiment of the present disclosure. FIG. 2 is a cross-sectional view taken along the line 2-2 in FIG. 1. Reference is made to FIG. 2. The power semiconductor device 100 includes a substrate 110 and an epitaxy layer 120. Reference is made to FIG. 1 and FIG. 2. The substrate 110 includes an active region 112, a buffer region 114, and a termination region 116. In the perspective of FIG. 1, the buffer region 114 and the termination region 116 have ring shape. The buffer region 114 and the termination region 116 surround the active region 112.

In the present embodiment, the buffer region 114 is located between the active region 112 and the termination region 116, and the termination region 116 surrounds the buffer region 114. The present disclosure is not limited thereto. The epitaxy layer 120 is located on the substrate 110. The epitaxy layer 120 is located in the active region 112, the buffer region 114, and the termination region 116. In other words, the epitaxy layer 120 extends to the buffer region 114 and the termination region 116 from the active region 112.

The power semiconductor device 100 of the present disclosure is a N-type (first conductive type) device. The epitaxy layer 120 and the substrate 110 have the first conductive type (N-type). The substrate 110 is an N-type heavily-doped substrate (N+). The doping concentration of the epitaxy layer 120 (N−) is lower than the doping concentration of the substrate 110. The epitaxy layer 120 is an extension for providing a drift region between the source S and the drain D.

As shown in FIG. 2, the power semiconductor device 100 further includes a source electrode 130 and a first metal layer 140. The source electrode 130 is located in the active region 112. The first metal layer 140 is located in the buffer region 114. The first metal layer 140 is connected to the source electrode 130. The power semiconductor device 100 further includes a drain electrode 150 and a second metal layer 160. The drain electrode 150 is located in the active region 112. The second metal layer 160 is located in the buffer region 114. The second metal layer 160 is connected to the drain electrode 150. The source electrode 130 and the first metal layer 140 are located on the epitaxy layer 120. The drain electrode 150 and the second metal layer 160 are located below the substrate 110. The substrate 110 and the epitaxy layer 120 are located between the source electrode 130 and the drain electrode 150 and located between the first metal layer 140 and the second metal layer 160.

As shown in FIG. 2, the power semiconductor device 100 further includes a gate electrode 170 and a first oxide layer 180. The gate electrode 170 and the first oxide layer 180 are located in the active region 112. The gate electrode 170 and the first oxide layer 180 are located between the source electrode 130 and the epitaxy layer 120. The gate electrode 170 is a poly-silicon gate, and the first oxide layer 180 includes silicon oxide. The first oxide layer 180 surrounds the gate electrode 170 and separates the gate electrode 170 and the epitaxy layer 120. In the present embodiment, the first metal layer 140 in the buffer region 114 surrounds the gate electrode 170 and the first oxide layer 180 in the active region 112.

The power semiconductor device 100 further includes a doped well 122, a source region 132, and a heavily-doped region 124 in the active region 112. The doped well 122 is a P-type doped-region (second conductive type), and the source region 132 is an N-type doped-region. The source region 132 and the heavily-doped region 124 are located in the doped well 122. The source electrode 130 is electrically connected to the source region 132. The heavily-doped region 124 is P-type heavily-doped region (P+). The P-type doped well 122 and the N-type source region 132 formed a channel region CH therebetween.

The power semiconductor device 100 further includes a second oxide layer 190 and a first doped region 126 located in the termination region 116. The first doped region 126 is located at a side of the epitaxy layer 120 facing the second oxide layer 190. The second oxide layer 190 covers the first doped region 126 and the epitaxy layer 120. The second oxide layer 190 in the termination region 116 surrounds the first metal layer 140 in the buffer region 114. In the present embodiment, the power semiconductor device 100 includes multiple first doped regions 126 separated from each other, but the present disclosure is not limited thereto. The first doped region 126 is P-type doped-region. That is, the first doped region 126 and the heavily-doped region 124 have the same conductive type. The first doped region 126 is configured as a guard ring structure for reducing electrical field crowding. The practical structure of the termination region 116 of the present disclosure is merely an example, and the present disclosure is not limited thereto.

The aforementioned structure that forms the source S, the drain D, and the gate G in the active region 112 is a vertical Metal-Oxide-Semiconductor Field-Effect Transistor (MOSFET). In general, the P-type heavily-doped region 124 and the N-type epitaxy layer 120 in the active region 112 form a parasitic diode of the MOSFET. However, an area of the parasitic diode in the active region 112 is small, and therefore electrical current can be loaded is lower. The first metal layer 140 and the epitaxy layer 120 in the buffer region 114 are jointed to form a Schottky Barrier Diode (SBD). The first metal layer 140 is connected to the source electrode 130 such that the Schottky Barrier Diode in the buffer region 114 is used to form a parallel circuit with the MOSFET in the active region 112. As such, the area of the parasitic diode is enlarged and the current of the parasitic diode is increased. In other embodiments, other types of the diode can be used in the buffer region 114, which will be described in the following paragraphs.

The active region 112, the buffer region 114, and the termination region 116 of the present disclosure are formed in the same package. Specifically, the first metal layer 140 and the source electrode 130 are integrated formed, and the first doped region 126 and the heavily-doped region 124 are formed in the same implantation step. In other words, the manufacturing process of the buffer region 114 can be integrated with the manufacturing process of the active region 112. As such, the power semiconductor device 100 can protect electrical circuits and the performance is enhanced when one package is omitted. Therefore, the cost and the volume of power semiconductor device 100 of the present disclosure can be reduced.

Figure 3:
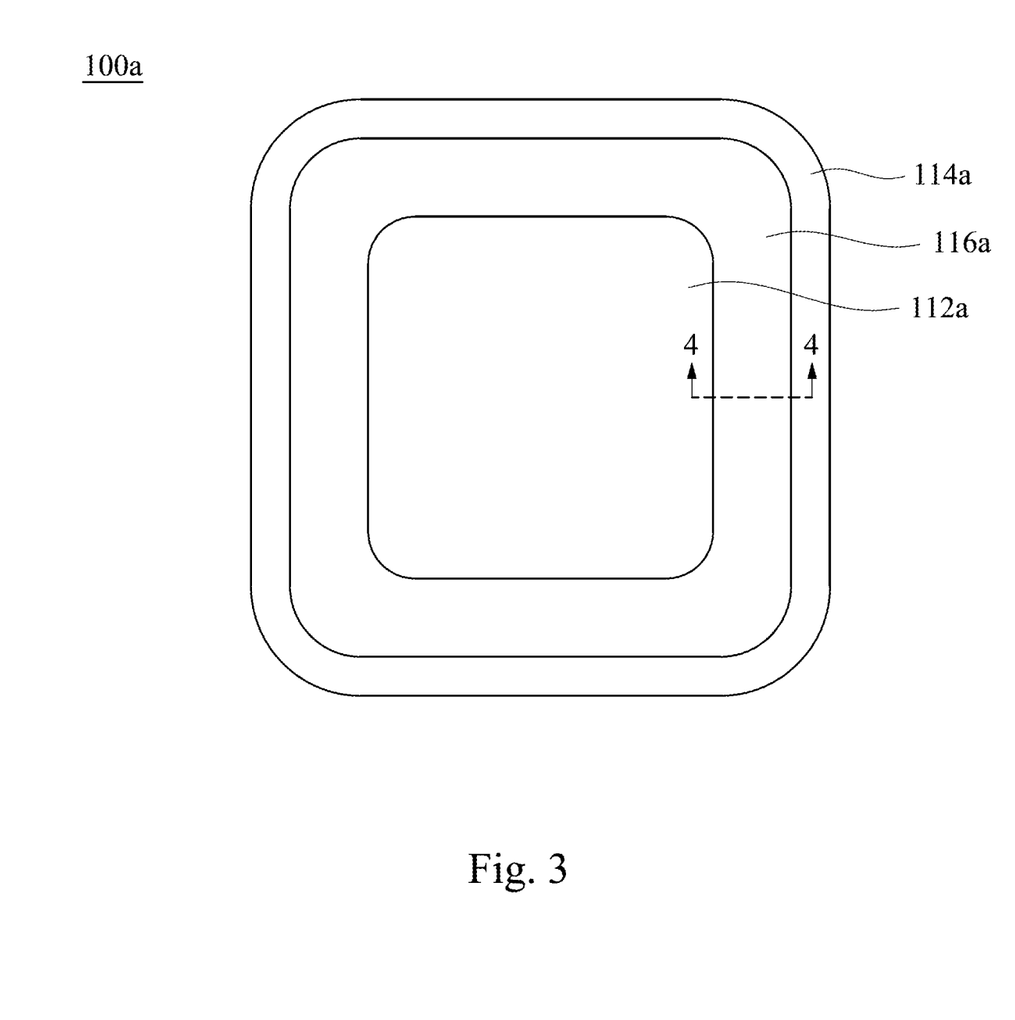
FIG. 3 is a top view of a power semiconductor device according to another embodiment of the present disclosure.
Figure 4:
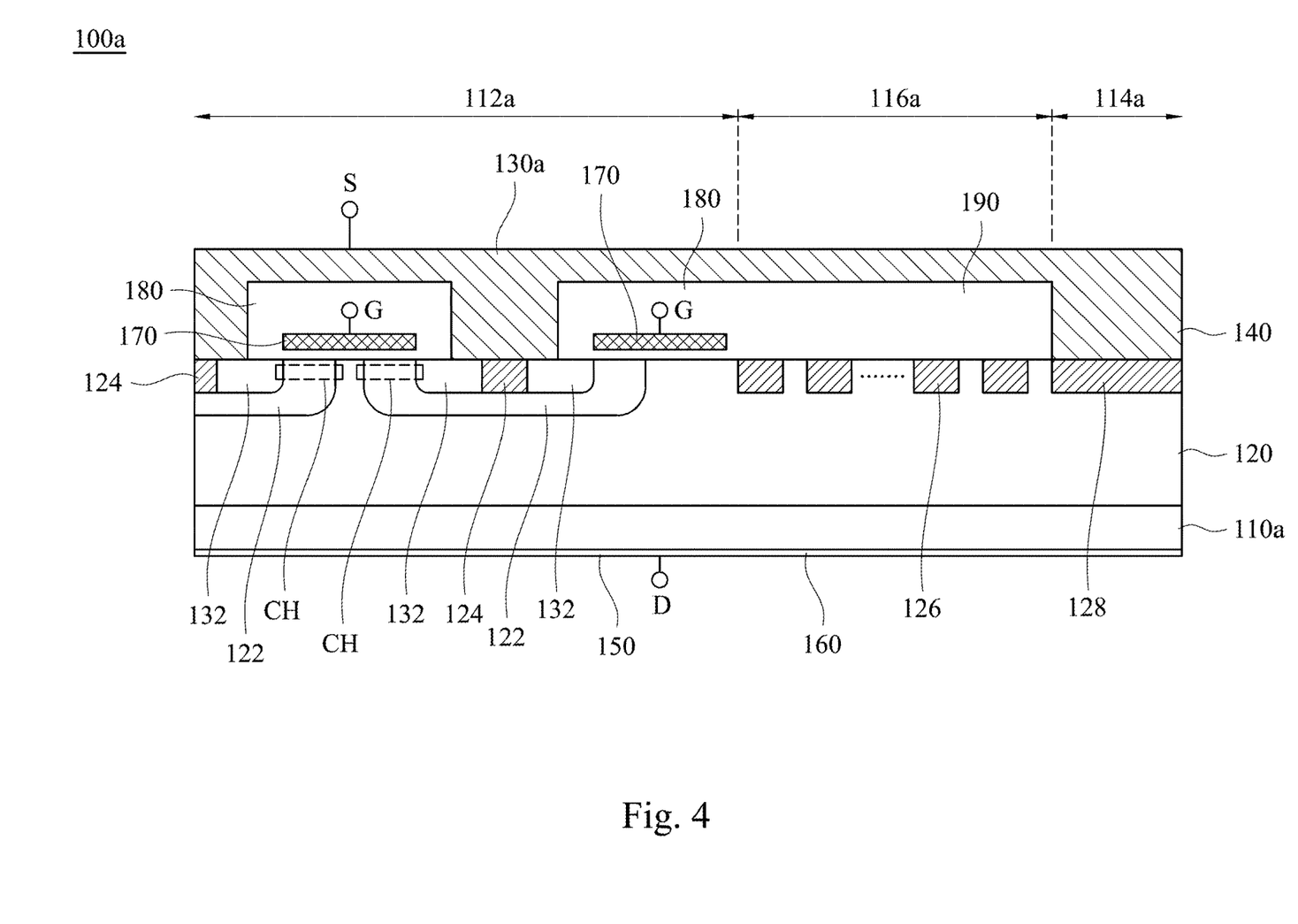
FIG. 4 is a cross-sectional view taken along line 4-4 in FIG. 3.

FIG. 3 is a top view of a power semiconductor device 100a according to another embodiment of the present disclosure. FIG. 4 is a cross-sectional view taken along the line 4-4 in FIG. 3. The power semiconductor device 100a includes a substrate 110a and an epitaxy layer 120. The substrate 110a includes an active region 112a, a buffer region 114a, and a termination region 116a. In the perspective of FIG. 3, the buffer region 114a and the termination region 116a have ring shape. The buffer region 114a and the termination region 116a surround the active region 112.

In the present embodiment, the termination region 116a is located between the active region 112a and the buffer region 114a, and the buffer region 114a surrounds the termination region 116a. The epitaxy layer 120 is located on the substrate 110a. The epitaxy layer 120 extends to the buffer region 114a and the termination region 116a from the active region 112a. In the present embodiment, the second oxide layer 190 in the termination region 116a is connected to the first oxide layer 180 in the active region 112a.

The conductive type and the doping concentration of the substrate 110a, the epitaxy layer 120, the doped well 122, the source region 132, and the heavily-doped region 124 are substantially the same as those of the power semiconductor device 100 shown in FIG. 2. In the present embodiment, the source electrode 130a of the power semiconductor device 100a extends to the buffer region 114a and is connected to the first metal layer 140 in the termination region 116a. In other words, the second oxide layer 190 is located between the source electrode 130a and the epitaxy layer 120. The first metal layer 140 surrounds the first oxide layer 180 and the second oxide layer 190.

In the present embodiment, the power semiconductor device 100a further includes a second doped region 128 located in the buffer region 114a. The second doped region 128 is a P-type heavily-doped region (P+). That is, the second doped region 128, the first doped region 126, and the heavily-doped region 124 have the same conductive type (second conductive type). The second doped region 128 is located at a side of the epitaxy layer 120 facing the first metal layer 140. The P-type second doped region 128 and the N-type epitaxy layer 120 in the buffer region 114a form a PN diode. In other embodiments, the power semiconductor device 100a may have no second doped region 128. That is, the Schottky Barrier Diode in the power semiconductor device 100 shown in FIG. 2 can be used in the buffer region 114a of the power semiconductor device 100a. Similarly, in other embodiments, the buffer region 114 of the power semiconductor device 100 may have the PN diode in the buffer region 114a of the power semiconductor device 100a.

The active region 112a, the buffer region 114a, and the termination region 116a of the present disclosure are formed in the same package. Specifically, the first metal layer 140 and the source electrode 130a are integrated formed, and the second doped region 128, the first doped region 126, and the heavily-doped region 124 are formed in the same implantation step. In other words, the manufacturing process of the buffer region 114a can be integrated with the manufacturing process of the active region 112a. Therefore, the power semiconductor device 100b and the power semiconductor device 100 have the same advantages, and the description is not repeated hereinafter.

Figure 5:
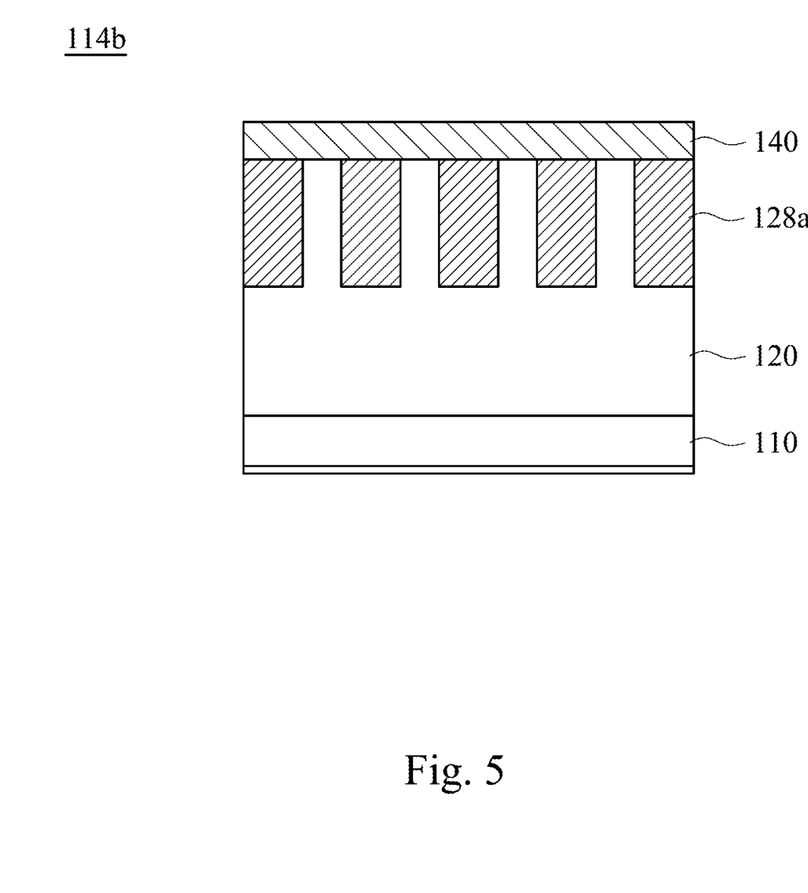
FIG. 5 is a cross-sectional view of a buffer region according to another embodiment of the present disclosure.

FIG. 5 is a cross-sectional view of a buffer region 114b according to another embodiment of the present disclosure. The buffer region 114b is substantially the same as the buffer region 114a of the power semiconductor device 100a shown in FIG. 4, and the difference is that the buffer region 114b of the present embodiment is a Junction Barrier Schottky diode (JBS).

In the present embodiment, multiple second doped regions 128a separated from each other are located in the epitaxy layer 120. The second doped regions 128a are located at a side of the epitaxy layer 120 facing the first metal layer 140. The JBS in the buffer region 114b can be used in the power semiconductor device 100 shown in FIG. 2 and the power semiconductor device 100a shown in FIG. 4.

Figure 6:
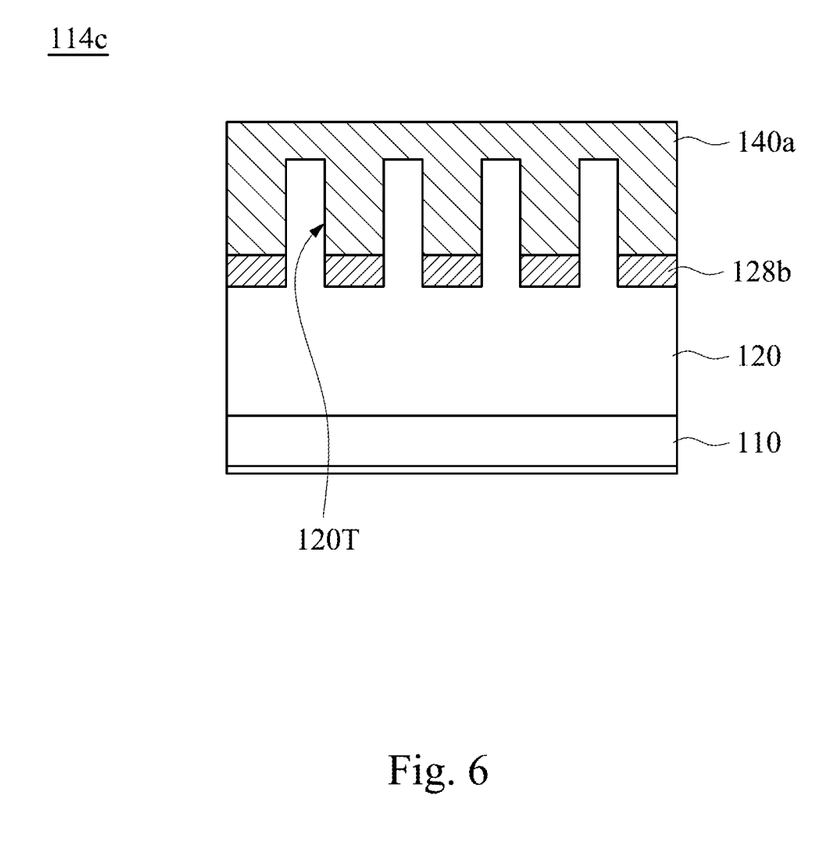
FIG. 6 is a cross-sectional view of a buffer region according to another embodiment of the present disclosure.

FIG. 6 is a cross-sectional view of a buffer region 114c according to another embodiment of the present disclosure. The buffer region 114c is substantially the same as the buffer region 114b of the power semiconductor device 100b shown in FIG. 5, and the difference is that the buffer region 114c of the present embodiment is a Trench Junction Barrier Schottky diode (TJBS Diode).

In the present embodiment, the epitaxy layer 120 includes multiple second doped regions 128b and multiple trenches 120T in the buffer region 114c. The first metal layer 140a extends into the trenches 120T in the epitaxy layer 120, and the trenches 120T are located above the second doped regions 128b. The TJBS Diode in the buffer region 114c can be used in the power semiconductor device 100 shown in FIG. 2 and the power semiconductor device 100a shown in FIG. 4.

Figure 7:
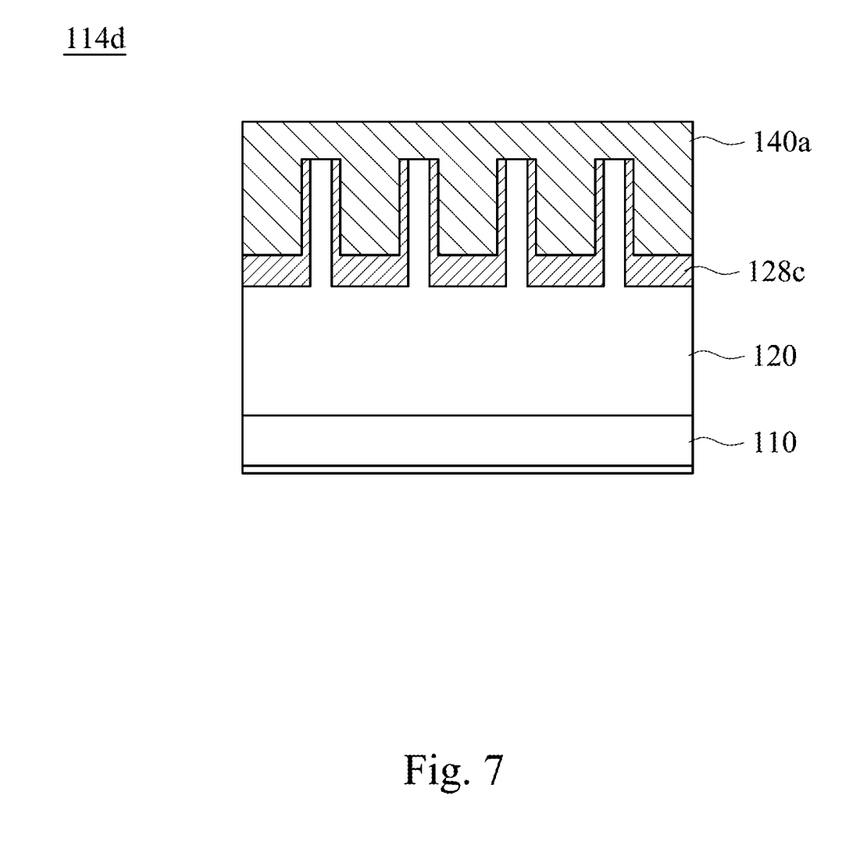
FIG. 7 is a cross-sectional view of a buffer region according to another embodiment of the present disclosure.

FIG. 7 is a cross-sectional view of a buffer region 114d according to another embodiment of the present disclosure. The buffer region 114d is substantially the same as the buffer region 114c shown in FIG. 6, and the difference is that the buffer region 114d of the present embodiment is another type of the Trench Junction Barrier Schottky diode (TJBS Diode). In the present embodiment, the second doped regions 128c surrounds the trenches 120T. The TJBS Diode in the buffer region 114d can be used in the power semiconductor device 100 shown in FIG. 2 and the power semiconductor device 100a shown in FIG. 4.

In summary, the first metal layer is connected to the source electrode such that the diode in the buffer region is used to form a parallel circuit with the MOSFET in the active region. As such, the area of the parasitic diode is enlarged and the current of the parasitic diode is increased. The active region, the buffer region, and the termination region of the present disclosure are formed in the same package. Specifically, the first metal layer and the source electrode are integrated formed. In other words, the manufacturing process of the buffer region can be integrated with the manufacturing process of the active region. As such, the power semiconductor device can protect electrical circuits and the performance is enhanced when one package is omitted. Therefore, the cost and the volume of power semiconductor device of the present disclosure can be reduced.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power semiconductor device, comprising:
   a substrate comprising an active region, a buffer region, and a termination region, wherein the buffer region surrounds the active region, and the termination region surrounds the active region;
   an epitaxy layer located on the substrate, wherein the epitaxy layer is located in the active region, the buffer region, and the termination region, and the epitaxy layer has a first conductive type, wherein the epitaxy layer further comprises a plurality of doped regions and a plurality of trenches, the doped regions are located in the buffer region, the doped regions have a second conductive type, the trenches are located in the buffer region, and the trenches are located above the doped regions or the doped regions surround the trenches;
   a source electrode located in the active region; and
   a first metal layer located in the buffer region, wherein the first metal layer is connected to the source electrode, the doped regions are located at a side of the epitaxy layer facing the first metal layer, and the first metal layer extends into the plurality of trenches.

2. The power semiconductor device of claim 1, further comprising:
   a gate electrode located in the active region; and
   a first oxide layer located in the active region, wherein the first oxide layer surrounds the gate electrode, and the first metal layer surrounds the gate electrode and the first oxide layer.

3. The power semiconductor device of claim 2, further comprising:
   a second oxide layer located in the termination region, wherein the second oxide layer is connected to the first oxide layer.

4. The power semiconductor device of claim 1, wherein the termination region is located between the active region and the buffer region, and the buffer region surrounds the termination region.

5. The power semiconductor device of claim 1, further comprising:
   a second oxide layer located in the termination region, wherein the second oxide layer surrounds the first metal layer.

6. The power semiconductor device of claim 1, wherein the buffer region is located between the active region and the termination region, and the termination region surrounds the buffer region.

7. The power semiconductor device of claim 1, wherein the epitaxy layer further comprises a doped region, the doped region is located in the buffer region, the doped region is located at a side of the epitaxy layer facing the first metal layer, and the doped region has a second conductive type.

8. A power semiconductor device, comprising:
   a substrate comprising an active region, a buffer region, and a termination region, wherein the buffer region and the termination region have a ring shape, and the buffer region and the termination region are located outside the active region;
   an epitaxy layer located on the substrate, wherein the epitaxy layer is located in the active region, the buffer region, and the termination region, wherein the epitaxy layer further comprises a plurality of doped regions and a plurality of trenches, the doped regions are located in the buffer region, the doped regions have a second conductive type, the trenches are located in the buffer region, and the trenches are located above the doped regions or the doped regions surround the trenches;
   a source electrode located in the active region; and
   a first metal layer located in the buffer region, wherein the first metal layer is connected to the source electrode, and the doped regions are located at a side of the epitaxy layer facing the first metal layer, and the first metal layer extends into the plurality of trenches.

9. The power semiconductor device of claim 8, further comprising:
   a drain electrode located in the active region, wherein the substrate and the epitaxy layer are located between the source electrode and the drain electrode; and
   a second metal layer located in the buffer region, wherein the substrate and the epitaxy layer are located between the first metal layer and the second metal layer, and the second metal layer is connected to the drain electrode.

10. The power semiconductor device of claim 8, further comprising:
    a gate electrode located in the active region; and
    a first oxide layer located in the active region, wherein the first oxide layer surrounds the gate electrode, and the first metal layer surrounds the gate electrode and the first oxide layer.

11. The power semiconductor device of claim 8, wherein the buffer region is located between the active region and the termination region, and the termination region surrounds the buffer region.

12. The power semiconductor device of claim 8, wherein the termination region is located between the active region and the buffer region, and the buffer region surrounds the termination region.

13. A power semiconductor device, comprising:
    a substrate comprising an active region, a buffer region, and a termination region;
    an epitaxy layer located on the substrate, wherein the epitaxy layer is located in the active region and the termination region, and the epitaxy layer has a first conductive type, wherein the epitaxy layer further comprises a plurality of doped regions and a plurality of trenches, the doped regions are located in the buffer region, the doped regions have a second conductive type, the trenches are located in the buffer region, and the trenches are located above the doped regions or the doped regions surround the trenches; and a diode located outside the active region and comprises a first metal layer, wherein the diode surrounds the active region, and the active region, the diode, the termination region are connected to each other, and the doped regions are located at a side of the epitaxy layer facing the first metal layer, and the first metal layer extends into the plurality of trenches.

14. The power semiconductor device of claim 13, wherein the power semiconductor device further comprises:

a source electrode located in the active region, wherein the first metal layer is connected to the source electrode.

15. The power semiconductor device of claim 13, wherein the diode is located between the active region and the termination region, and the termination region surrounds the diode.

16. The power semiconductor device of claim 13, wherein the termination region is located between the active region and the diode, and the diode surrounds the termination region.

17. The power semiconductor device of claim 13, wherein the diode further comprises a doped region, and the doped region has a second conductive type.

* * * * *